United States Patent
Liang

[11] Patent Number: 5,854,103
[45] Date of Patent: Dec. 29, 1998

[54] MANUFACTURING METHOD OF SELF-ALIGNED SILICIDE LOAD FOR STATIC RANDOM ACCESS MEMORY

[75] Inventor: Kuei-Chang Liang, Taipei Hsien, Taiwan

[73] Assignee: Winbond Electronics Corporation, Taiwan

[21] Appl. No.: 941,081

[22] Filed: Sep. 30, 1997

[30] Foreign Application Priority Data

Aug. 16, 1997 [TW] Taiwan .................................. 86111797

[51] Int. Cl.$^6$ ................................................. H01L 21/8244
[52] U.S. Cl. ............................ 438/238; 438/381; 438/649
[58] Field of Search ..................................... 438/649–653, 438/682–686, 238, 241, 381–385; 257/904

[56] References Cited

U.S. PATENT DOCUMENTS

4,551,907 11/1985 Mukai .
5,330,930 7/1994 Chi .

*Primary Examiner*—Jey Tsai
*Attorney, Agent, or Firm*—Rabin & Champagne, P.C.

[57] ABSTRACT

A self-aligned suicide SRAM load structure and its manufacturing method comprising the steps of providing a semiconductor substrate; then forming a first insulating layer over the substrate and etching an opening. Thereafter, a polysilicon layer is formed over the first insulating layer and the opening, and then a second insulating layer is formed over the polysilicon layer. Next, a photoresist layer for creating a connector pattern is formed over the second insulating layer using microlithographic processes. The second insulating layer is then etched to expose portions of the polysilicon layer. Subsequently, a metallic layer is deposited over the exposed polysilicon layer and the second insulating layer. Then, the metallic layer reacts with the polysilicon layer through heating until the two layers are completely converted into a metal silicide layer. The metal silicide layer functions as connectors, and the unreacted polysilicon layer beneath the second insulating layer functions as a polysilicon load.

15 Claims, 8 Drawing Sheets

MANUFACTURING METHOD OF SELF-ALIGNED SILICIDE LOAD FOR STATIC RANDOM ACCESS MEMORY

BACKGROUND OF THE INVENTION

1. Field of Invention

The present invention relates to a structure and manufacturing method of a static random access memory (SRAM) load. More particularly, the present invention relates to the structure and manufacturing method of an SRAM load that utilizes a self-aligned silicide process to fabricate a self-aligned silicide load.

2. Description of Related Art

Figure 1:
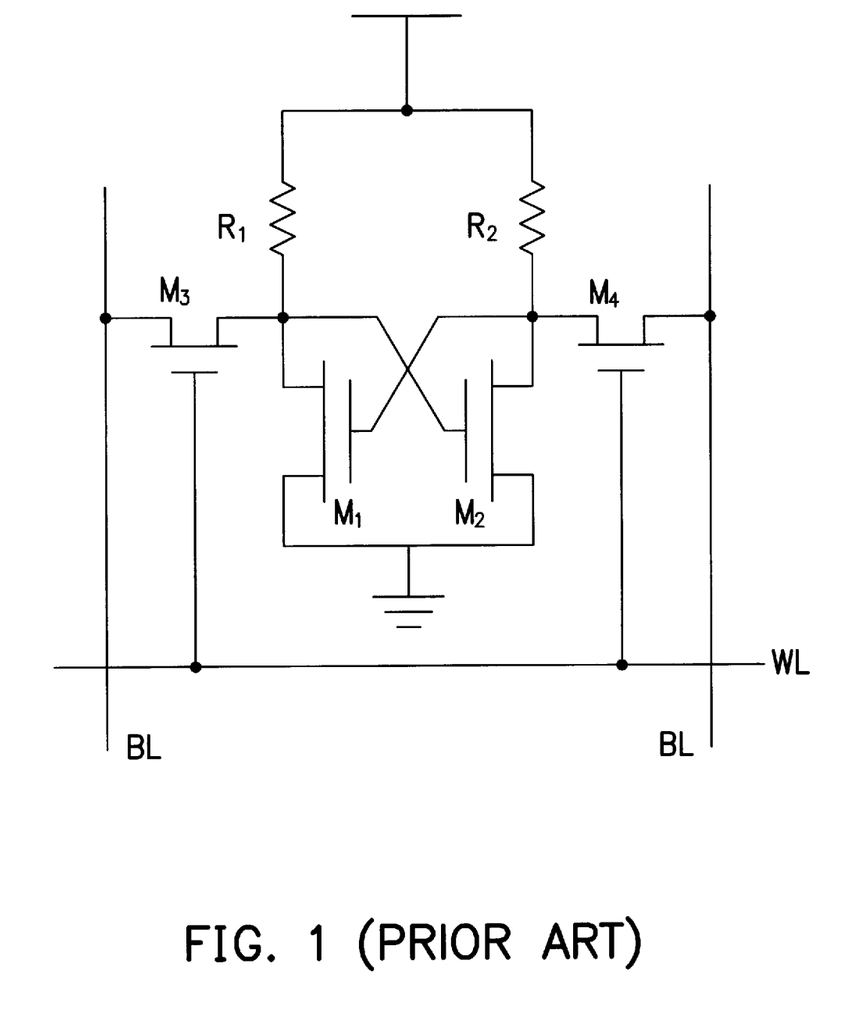
FIG. 1 is a circuit layout diagram of a conventional four-transistor static random access memory (4T SRAM)

FIG. 1 is a circuit layout diagram of a conventional four-transistor static random access memory (4T SRAM). As shown in FIG. 1, $R_1$ and $R_2$ are load resistors, and $M_1$ and $M_2$ are enhancement mode NMOS transistors that function as drivers. Also, there are enhancement mode NMOS transistors $M_3$ and $M_4$ that are used for accessing data contained in the SRAM. The gates of transistors $M_3$ and $M_4$ are controlled by a horizontal conducting line known as a word line (WL). The drain terminals of $M_3$ and $M_4$ are connected to transistor drivers $M_1$ and $M_2$, respectively. Therefore, the ON and OFF state of the transistors $M_1$ and $M_2$ are closely related to the switching states of transistors $M_3$ and $M_4$. The source terminals of $M_3$ and $M_4$ are each connected to a vertical conducting line known as a bit line (BL).

Figure 2A:
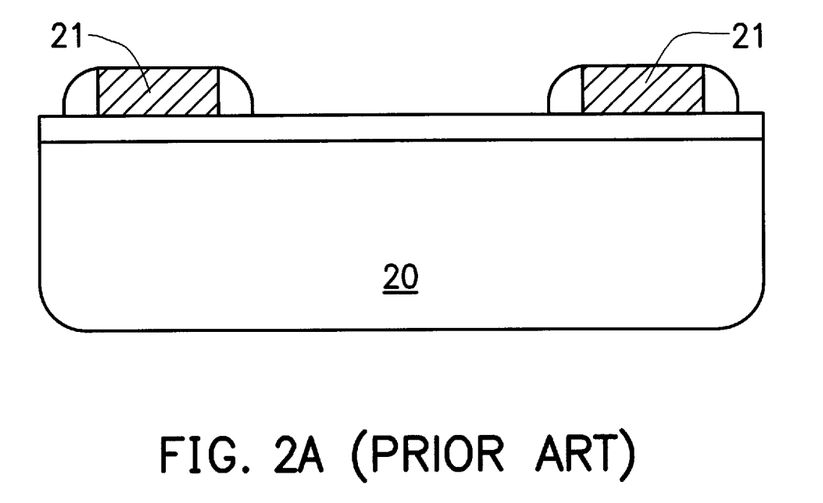
FIGS. 2A through 2D are cross-sectional views showing the progression of manufacturing steps in the fabrication of a conventional polysilicon SRAM load.
Figure 2B:
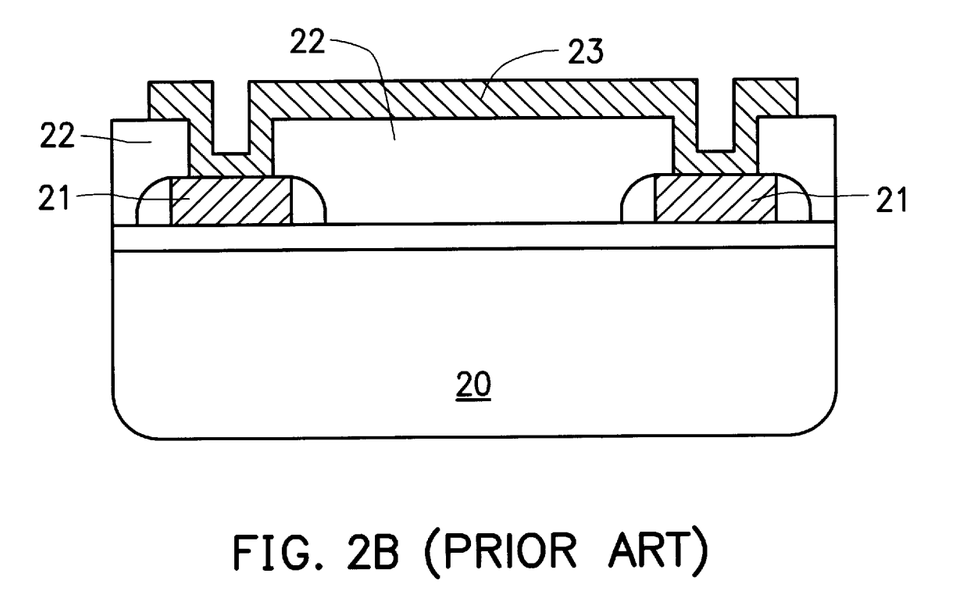

In general, a high resistance polysilicon line is used as a load resistor in a four-transistor SRAM (4T SRAM). FIGS. 2A through 2D are cross-sectional views showing the progression of manufacturing steps in the fabrication of a conventional polysilicon load. First, as shown in FIG. 2A, a semiconductor substrate 20 having some devices, for example, gates 21, already formed thereon is provided. Then, as shown in FIG. 2B, an insulating layer 22 is deposited over the semiconductor substrate 20 and the gate layers 21. Thereafter, microlithographic and etching processes are used to define a pattern on the insulating layer 22 and exposing portions of the gate layers 21. Next, a polysilicon layer 23 is formed over the insulating layer 22 and the exposed portions of the gate layer 21. Subsequently, the polysilicon layer 23 is patterned.

Figure 2C:
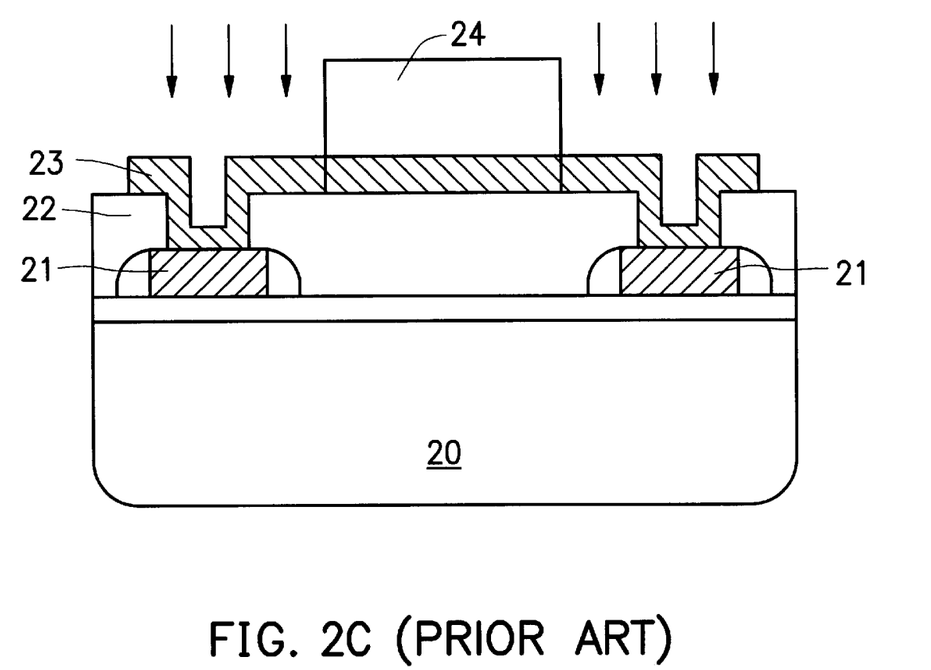
Figure 2D:
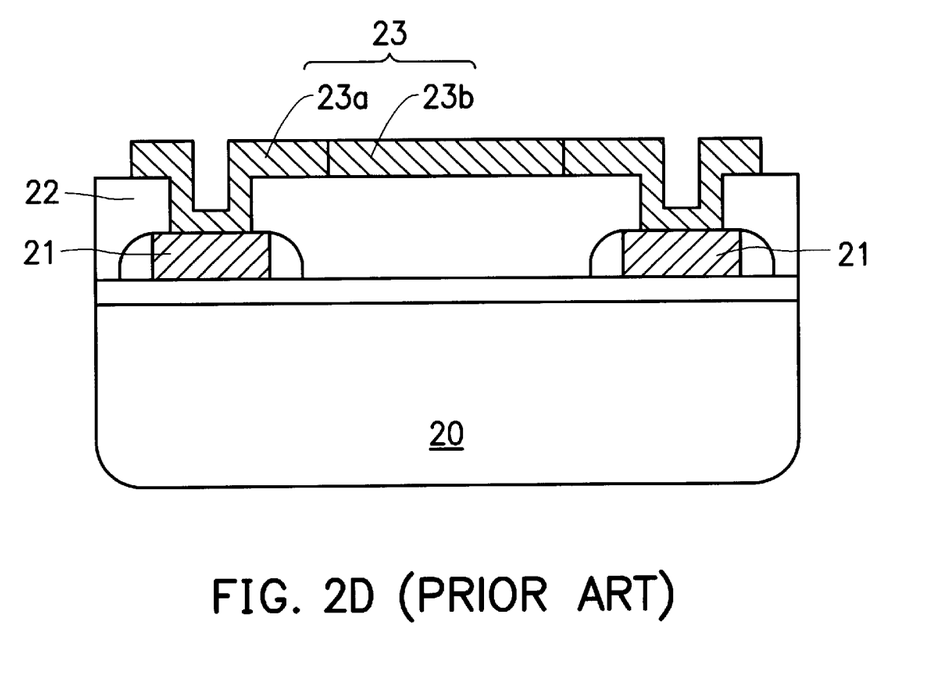

Next, as shown in FIG. 2C, a photoresist layer 24 is coated over the polysilicon layer 23, and then a pattern for the connectors is formed. Later, an ion implantation operation is performed using the photoresist layer 24 as a mask, thereby increasing the impurity concentration in the exposed portions of the polysilicon layers 23. Such connector implantation is therefore capable of a downward adjustment of connector resistance. Finally, as shown in FIG. 2D, the photoresist layer is removed, thus forming a polysilicon SRAM load structure. Through the above process, the polysilicon layer 23 is divided into two portions, namely, polysilicon lines 23a and 23b, respectively. Polysilicon line 23a has a lower resistance and can function as a connector. Polysilicon line 23b, on the other hand, has a higher resistance, and therefore can serve as a load resistor. In general, value of the load resistance is largely determined by factors such as the quantity of implanted impurities during the first implantation, thickness of the polysilicon film, the length L and width W of the polysilicon line 23b.

Figure 3:
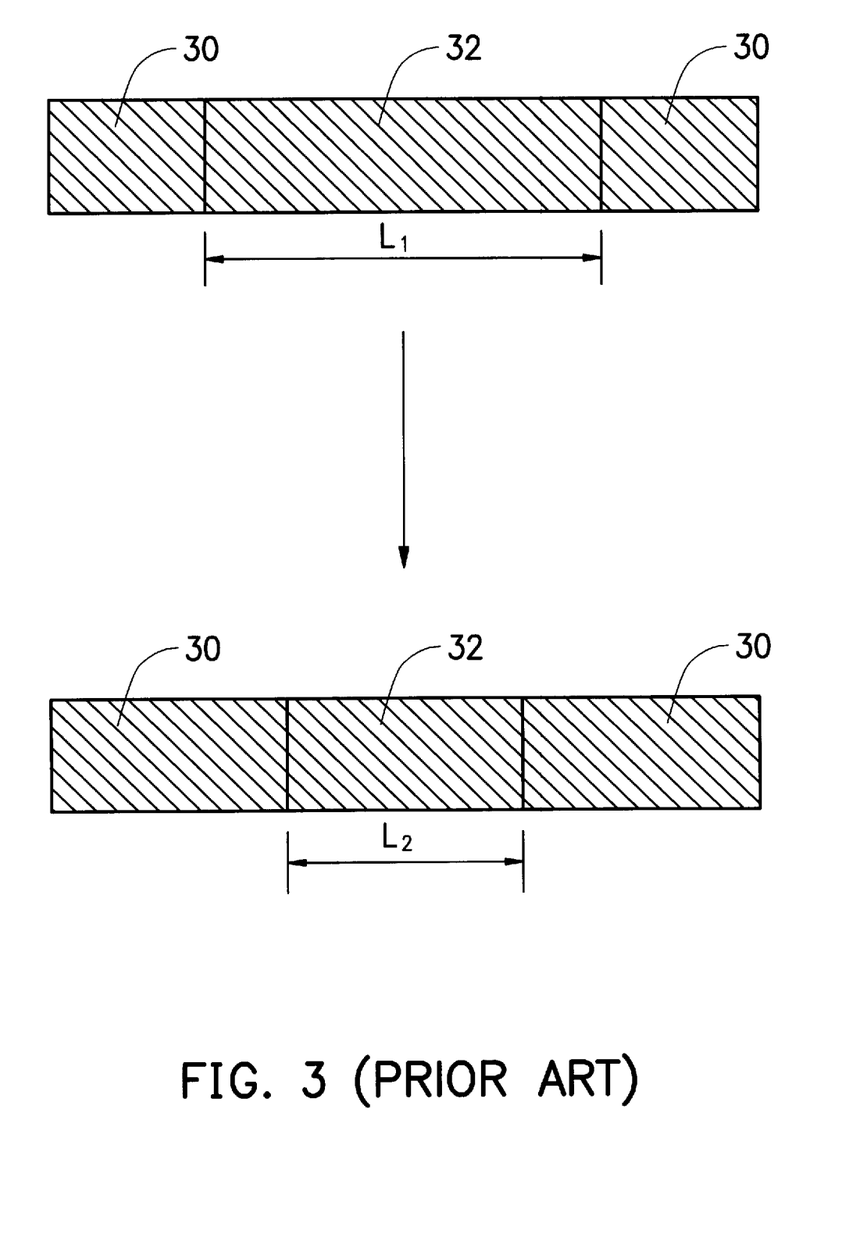
FIG. 3 is a side view showing the shortening of a conventional SRAM polysilicon load after a thermal processing operation.

In general, a high resistance is preferred for a conventional SRAM load resistor, and a low resistance is preferred for a connector. As SRAM cells are miniaturized further, the conventional method of polysilicon load formation is becoming less and less satisfactory in providing a load having a sufficiently high resistance. As shown in FIG. 3, the main reason is that during subsequent thermal processing operations, highly concentrated impurities previously implanted into the connector regions 30 will out-diffuse into the polysilicon load region 32. For example, the load length is changed from the original length $L_1$ to a smaller effective length $L_2$ due to out-diffusion. This presents a difficult problem for the conventional method when SRAM cells are further miniaturized in the future. The reason is that the linear dimension of a polysilicon load is incapable of any more extension. Furthermore, how to reduce the width of a polysilicon load still requires a major technical breakthrough. Therefore, our inability to shorten the conventionally made polysilicon load any further is a major drawback for future dimensional reduction of memory cells.

In light of the foregoing, there is a need in the art to provide an improved structure and manufacturing method for forming a load resistor.

SUMMARY OF THE INVENTION

Accordingly, the present invention is directed to provide a self-aligned silicide SRAM load structure and its manufacturing method that can maintain a fixed load length but having a lower connector resistance.

The invention removes the drawbacks and difficulties of miniaturizing a memory cell due to a conventionally formed load resistor.

To achieve these and other advantages and in accordance with the purpose of the invention, as embodied and broadly described herein, the invention provides a self-aligned silicide SRAM load structure and its manufacturing method. The method comprises the steps of first providing a semiconductor substrate having a device layer already formed thereon. Next, a first insulating layer is formed over the device layer, and then an opening is etched to expose portions of the device layer. Thereafter, a polysilicon layer is formed over the first insulating layer and the opening, and then a second insulating layer is formed over the polysilicon layer. Microlithographic processes are used to form a photoresist layer over the second insulating layer for creating a connector pattern. Thereafter, the second insulating layer is etched to expose portions of the polysilicon layer. Subsequently, a metallic layer is deposited over the exposed polysilicon layer and the second insulating layer. Then, the metallic layer reacts with the polysilicon layer through heating until the two layers are completely converted into a metal silicide layer. The metal silicide layer functions as connectors, and the unreacted polysilicon layer beneath the second insulating layer functions as a polysilicon load.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in. the drawings and the description to refer to the same or like parts.

One important characteristic of the self-aligned silicide SRAM load according to this invention is that a self-aligned silicide process is used to form a metal silicide layer specifically for the connectors. Consequently, connectors and loads are made from different types of material. On the contrary, an ion implantation process is used to form the connectors and the loads in a conventional method. Because what distinguishes a connector from a load is their respective levels of ion concentration and not their material compositions, subsequent thermal processing operations are liable to cause the out-diffusion of ions from the connectors to the polysilicon loads. Therefore, the effective length of a polysilicon load is shortened. The structure provided by the invention is capable of rectifying the above defect, and maintaining an almost constant length for both the polysilicon load and the connector.

Figure 4A:
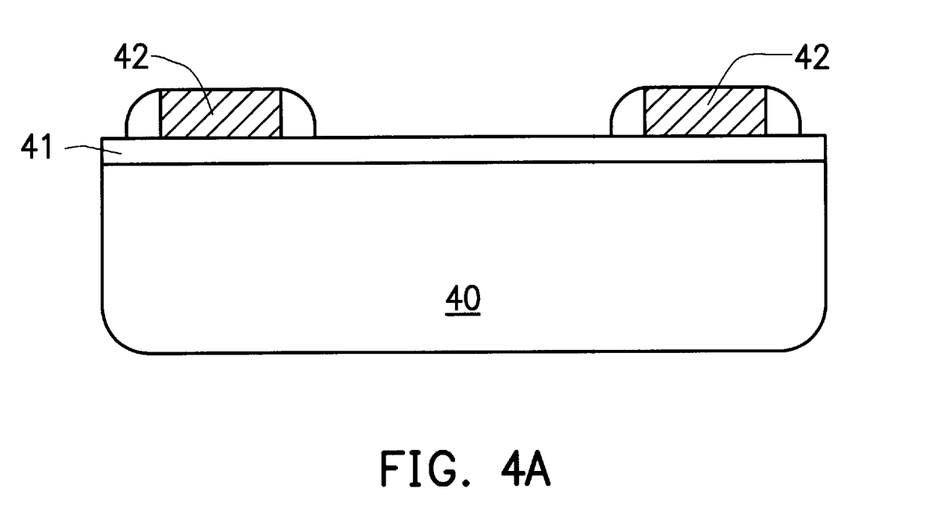
FIGS. 4A through 4F are cross-sectional views showing the progression of manufacturing steps in the fabrication of a self-aligned silicide SRAM load according to one preferred embodiment of this invention.
Figure 4B:
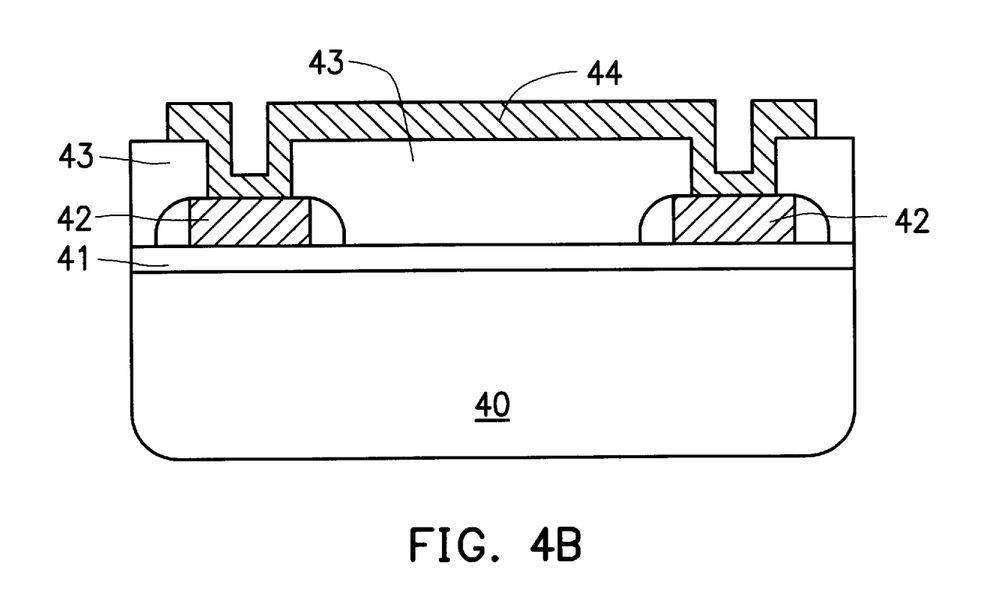

FIGS. 4A through 4F are cross-sectional views showing the progression of manufacturing steps in the fabrication of a self-aligned silicide SRAM load according to one preferred embodiment of this invention. First, as shown in FIG. 4A, a semiconductor substrate 40 having a device layer 41 formed thereon is provided. The device layer 41 can include various kinds of devices, for example, gate layers 42. Next, as shown in FIG. 4B, a first insulating layer 43 having a thickness of between 100 Å to 5000 Å is formed over the device layer 41 and the gate layers 42. Then, microlithographic and etching processes are used to form an opening in the first insulating layer 43 exposing portions of the gate layers 42. Subsequently, a polysilicon layer 44 having a thickness of between 100 Å to 2000 Å is formed over the first insulating layer 43 and the exposed gate layers 42. Thereafter, the polysilicon layer 44 is patterned.

Figure 4C:
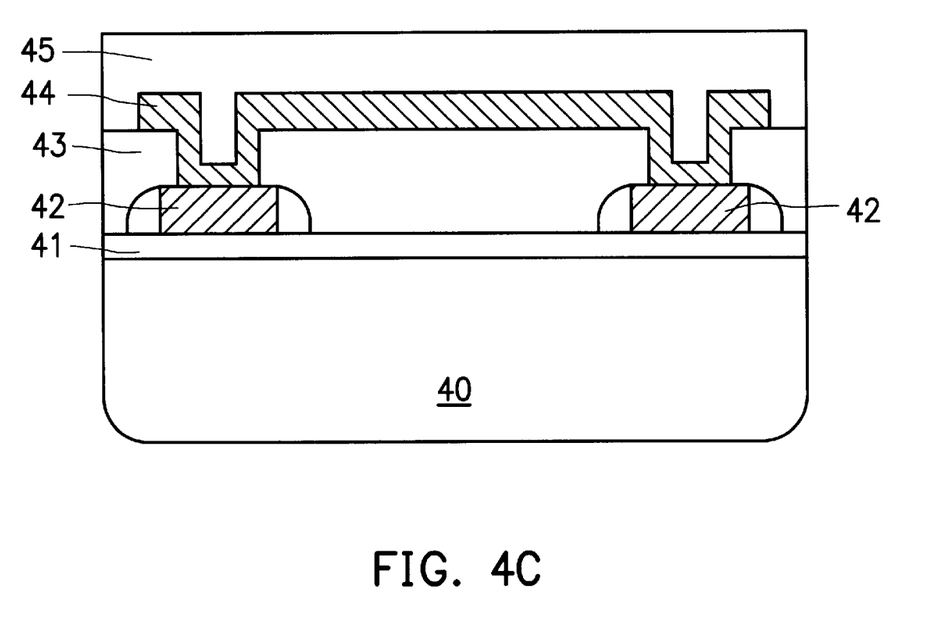
Figure 4D:
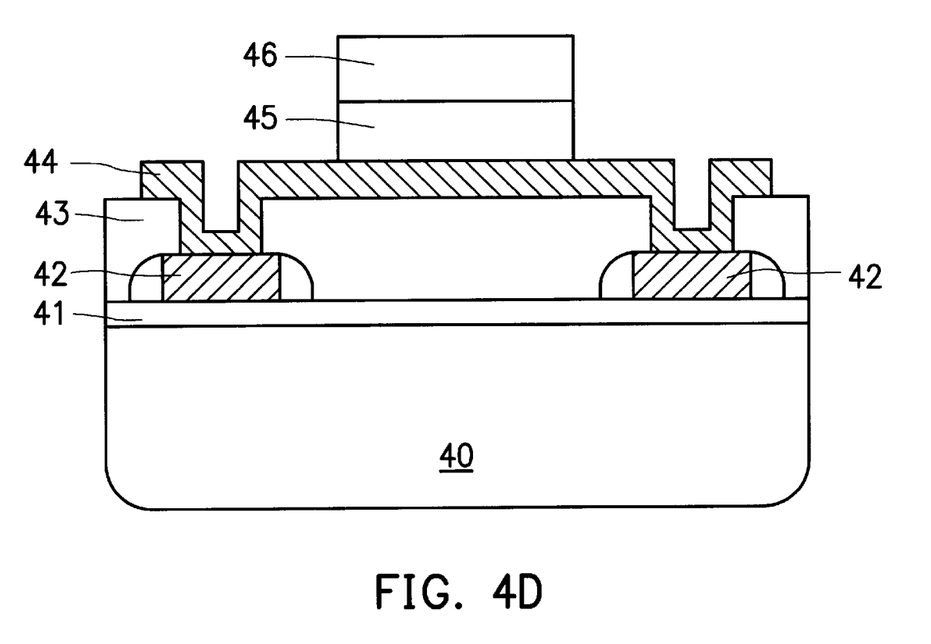

Next, as shown in FIG. 4C, a second insulating layer 45 having a thickness of between 100 Å to 5000 Å is formed above the polysilicon layer 44. Next, as shown in FIG. 4D, a photoresist layer 46 is formed over the second insulating layer 45, and then a pattern is defined on the photoresist layer 46 using microlithographic processes. Subsequently, the second insulating layer 45 is etched to expose portions of the polysilicon layer 44 using the photoresist layer 46 as a mask. The exposed polysilicon layer 44 is later used as a connector. An ion implantation operation is then performed to implant impurities into the exposed polysilicon layer 44 forming a heavily doped region. Thereafter, the photoresist layer 46 is removed.

Figure 4E:
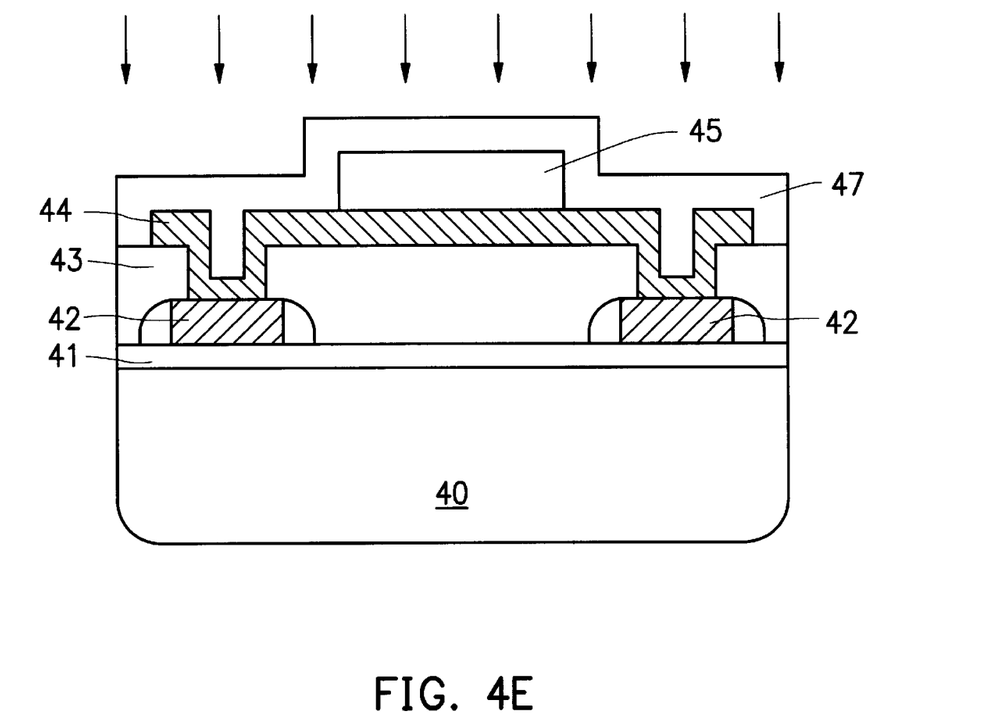

Next, as shown in FIG. 4E, a self-aligned silicide processing operation is carried out. First, a metallic layer 47 is formed over the exposed polysilicon layer 44 and the second insulating layer 45. The metallic layer is made from a refractory metal selected from one among the group including titanium, cobalt, platinum, palladium, nickel, molybdenum and niobium. Thereafter, a thermal processing operation is performed. For example, a rapid thermal processing (RTP) method is used to heat a titanium layer and the silicon layer below the titanium layer to a temperature of about 500° C. to 1200° C. Through heating, the titanium layer reacts with the silicon layer to form a titanium silicide layer having a thickness of about 100 Å to 2000 Å. Finally, the unreacted residual metal is removed.

Figure 4F:
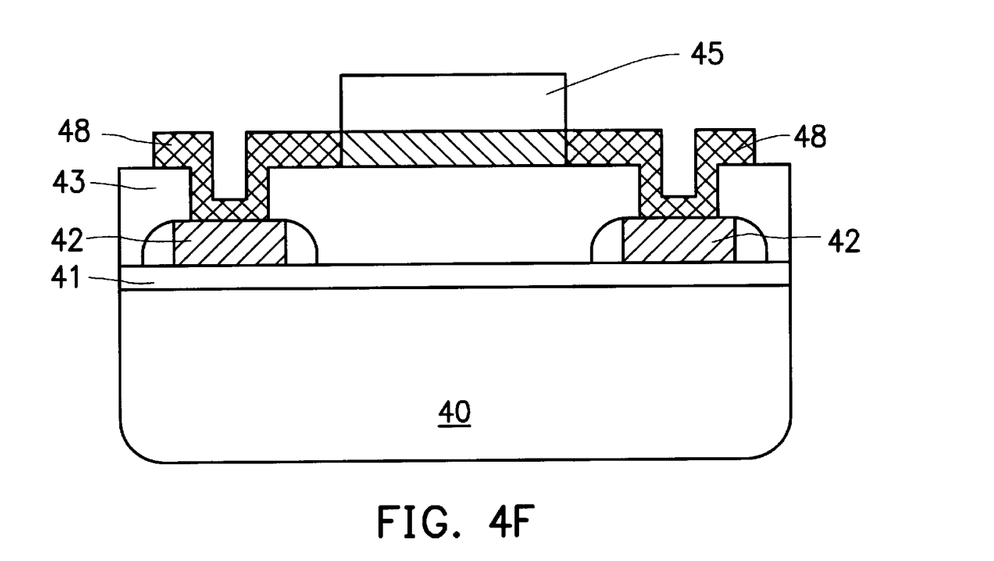

Next, as shown in FIG. 4F, thickness of the deposited metallic layer can be adjusted so that a suitable ratio of thickness between the metallic layer and the polysilicon layer 44 is achieved. The optimal ratio between a metallic layer 47 and a polysilicon layer 44 is found to be about 1:2. This ratio is optimal because the exposed polysilicon layer 44 will react completely with the metallic layer to form a metal silicide layer 48.

Figure 5:
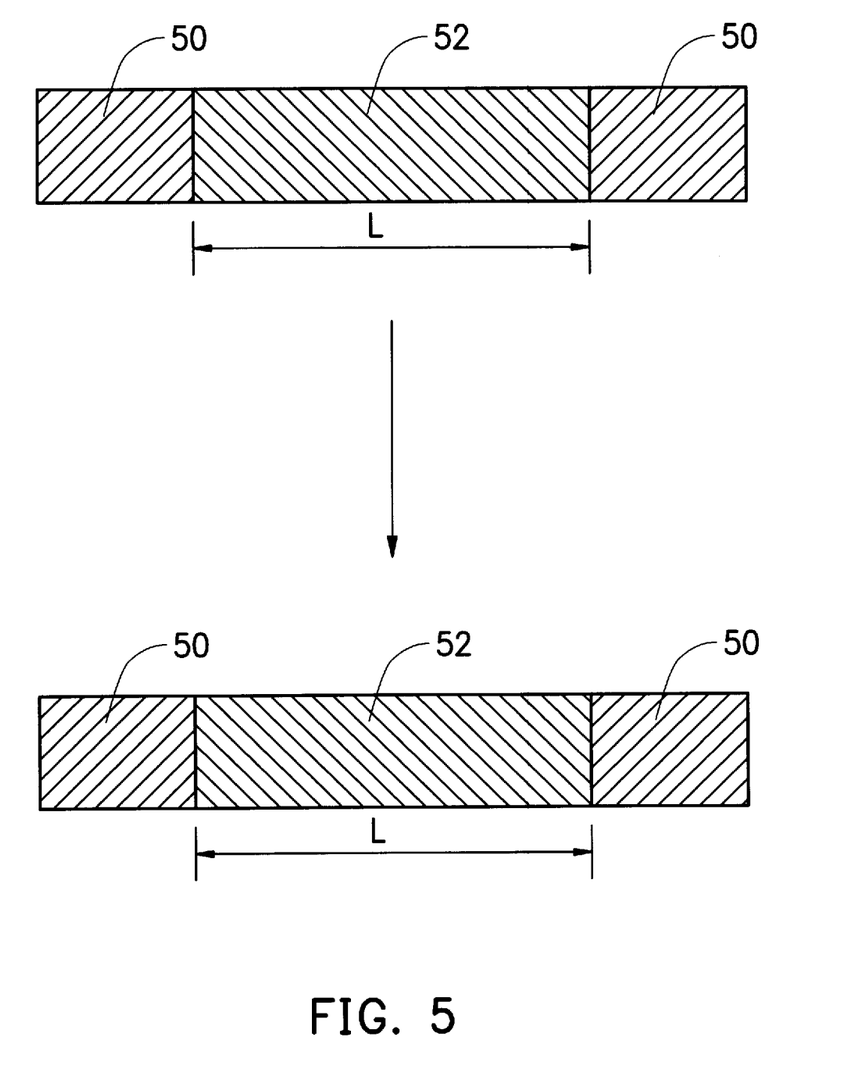
FIG. 5 is a side view showing the unchanged length of a self-aligned silicide load even after a thermal processing operation according to this invention.

FIG. 5 is a side view showing the unchanged length of a self-aligned silicide load even after a thermal processing operation according to this invention. As shown in FIG. 5, the two end regions are metal silicide connectors 50, and the structure in the middle between the connectors is a polysilicon load 52. When subsequent heating operations are performed, the metal silicide material in connectors 50 will not cause any shortening of the effective length of a polysilicon load 52. Therefore, the effective length of the polysilicon load 52 will remain fixed at a length L.

As a summary, the self-aligned silicide SRAM load structure and manufacturing method of this invention has the following characteristics:

(1) The load structure of this invention not only has a fixed length L, but also can maintain a constant resistance. Therefore, the invention rectifies the problem of impurity out-diffusion from connectors to the load resistor in a conventional method that results in a shortening of its effective length. This offers some benefits to the of future generation of miniaturized SRAM cells.

(2) The polysilicon layer normally used in a conventional connector is converted to a metal silicide layer in this invention. This material change offers the advantage of producing connectors having a lower resistance.

(3) The connector structure of this invention is formed by a self-aligned silicide process. Therefore, the processing steps are simple and easy to reproduce.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a self-aligned silicide static random access memory load, comprising the steps of:

Providing a semiconductor substrate having a device layer already formed thereon;

Forming a first insulating layer over the device layer;

Etching away portions of the first insulating layer to form an opening exposing portions of the device layer;

Forming a polysilicon layer over the first insulating layer and the opening;

Forming a second insulating layer over the polysilicon layer;

Forming a patterned photoresist layer over the second insulating layer using microlithographic processes;

Patterning a connector using the patterned photoresist layer;

Anisotropically etching away portions of the second insulating layer to expose portions of the polysilicon layer;

Removing the photoresist layer;

Performing an ion implantation process to dope impurities into the exposed polysilicon layer;

Forming a metallic layer over the exposed portions of the polysilicon layer and the second insulating layer;

Forming a metal silicide layer by heating to make the metallic layer react with the polysilicon layer below; and Removing any residual metallic layer and the second insulating layer.

2. The method of claim , wherein the first insulating layer has a thickness of about 100 Å to 5000 Å.

3. The method of claim 1, wherein the polysilicon layer has a thickness of about 100 Å to 2000 Å.

4. The method of claim 1, wherein thickness of the metallic layer and thickness of the polysilicon layer can be adjusted such that the exposed polysilicon layer can react completely with the metallic layer to form a metal silicide layer during a thermal processing operation.

5. The method of claim 1, wherein the ratio of thickness between a metallic layer and a polysilicon layer is about 1:2.

6. The method of claim 1, wherein the step of forming the metal silicide layer includes using a self-aligned suicide process.

7. The method of claim 1, wherein the step of forming the metallic layer includes depositing a refractory metal.

8. The method of claim 1, wherein the step of forming the metallic layer includes depositing titanium.

9. The method of claim 1, wherein the step of forming the metallic layer includes depositing cobalt.

10. The method of claim 1, wherein the step of forming the metallic layer includes depositing platinum.

11. The method of claim 1, wherein the step of forming the metallic layer includes depositing nickel.

12. The method of claim 1, wherein the step of forming the metallic layer includes depositing molybdenum.

13. The method of claim 1, wherein the step of forming the metallic layer includes depositing palladium.

14. The method of claim 1, wherein the step of forming the metallic layer includes depositing niobium.

15. The method of claim 1, wherein the step of heating includes using a rapid thermal processing method to heat up the polysilicon layer and the metallic layer to a temperature of between 500° C. to 1200° C. for their reaction.

* * * * *